(12) United States Patent
Hughes

(10) Patent No.: US 7,057,439 B2
(45) Date of Patent: Jun. 6, 2006

(54) SWITCHED-CURRENT INTEGRATOR

(75) Inventor: John Barry Hughes, Hove (GB)

(73) Assignee: Koninklijke Philips Electronics N.V., Eindhoven (NL)

( * ) Notice: Subject to any disclaimer, the term of this patent is extended or adjusted under 35 U.S.C. 154(b) by 23 days.

(21) Appl. No.: 10/500,687

(22) PCT Filed: Dec. 11, 2002

(86) PCT No.: PCT/IB02/05355

§ 371 (c)(1),
(2), (4) Date: Jul. 2, 2004

(87) PCT Pub. No.: WO03/058640

PCT Pub. Date: Jul. 17, 2003

(65) Prior Publication Data

US 2005/0104648 A1    May 19, 2005

(30) Foreign Application Priority Data

Jan. 8, 2002    (GB) ................... 0200289.7

(51) Int. Cl.
*G06G 7/18* (2006.01)
(52) U.S. Cl. ........................... 327/336; 327/94
(58) Field of Classification Search ................ 327/336, 327/337, 94, 344–345
See application file for complete search history.

(56) References Cited

U.S. PATENT DOCUMENTS 5,059,832 A    10/1991    Hughes
5,473,275 A  * 12/1995    Hughes et al. .............. 327/336
5,773,998 A  *  6/1998    Hughes et al. ................ 327/91
6,163,207 A  * 12/2000    Kattner et al. .............. 327/553

OTHER PUBLICATIONS

B.J. Minnis et al., "A Low-IF Polyphase Receiver for DECT", pp., I-60-I-63, IEEE International Symposium on Circuits and Systems, May 28-31, 2000.
John B. Hughes, "Top-Down Design of a Switched-Current Video Filter", pp. 73-81. IEEE Proc- Circuits Devices Syst. vol. 147, No. 1, Feb. 2000.
Lucien J. Breems et al., "A Quadrature Data-Dependent DEM Algorithm to Improve Image Rejection of a Complexed Modulator", pp. 1879-1886. IEEE Journal Solid-State Circuits.

* cited by examiner

*Primary Examiner*—Dinh T. Le

(57) ABSTRACT

A complex switched-current bilinear integrator (100) is formed as a pair of cross coupled real bilinear integrators and has inputs (10, 11, 12, 13) and outputs (14, 15, 16, 17) for differential pairs of in-phase (1) and quadrature-phase (Q) signals and an arrangement of sample-and-hold circuits (20, 30, 40, 50) and coupled scaling circuits (70, 71, 80, 81). Dynamic element matching is used to reduce the effect of mismatch between scaling circuits by interchanging scaling circuits in different signal paths. In order to prevent crosstalk of signals between different signal paths, the change of a scaling circuit coupled to a sample-and-hold circuit is constrained to occur only at the beginning of a sampling operation by that sample-and-hold circuit.

13 Claims, 15 Drawing Sheets

| Second output of integrator core-circuit | Scaling circuits coupled to specified second output of integrator core-circuit in specified period | | | | | | | |
|---|---|---|---|---|---|---|---|---|
| | First scale factor scaling circuit | | | | Second scale factor scaling circuit | | | |
| | $\Phi_{12}$ | $\Phi_{23}$ | $\Phi_{34}$ | $\Phi_{41}$ | $\Phi_{12}$ | $\Phi_{23}$ | $\Phi_{34}$ | $\Phi_{41}$ |
| 23 | | 711 | | 713 | | 811 | | 813 |
| 33 | 712 | | 714 | | 812 | | 814 | |
| 43 | | 713 | | 711 | | 813 | | 811 |
| 53 | 714 | | 712 | | 814 | | 812 | |

| First output of integrator core-circuit | Scaling circuits coupled to specified first output of integrator core-circuit in specified period | | | | | | | |
|---|---|---|---|---|---|---|---|---|
| | First scale factor scaling circuit | | | | Second scale factor scaling circuit | | | |
| | $\Phi_{12}$ | $\Phi_{23}$ | $\Phi_{34}$ | $\Phi_{41}$ | $\Phi_{12}$ | $\Phi_{23}$ | $\Phi_{34}$ | $\Phi_{41}$ |
| 22 | 701 | | 703 | | 801 | | 803 | |
| 32 | | 702 | | 704 | | 802 | | 804 |
| 42 | 703 | | 701 | | 803 | | 801 | |
| 52 | | 704 | | 702 | | 804 | | 802 |

FIG.8

| | Scaling circuits coupled to specified signal output in specified period | | | |
|---|---|---|---|---|
| | $\Phi_{12}$ | $\Phi_{23}$ | $\Phi_{34}$ | $\Phi_{41}$ |
| First signal output 14 ($I_o^-$) | 701 | 702 | 703 | 704 |
| Second signal output 15 ($I_o^+$) | 712 | 711 | 714 | 713 |
| Third signal output 16 ($Q_o^-$) | 703 | 704 | 701 | 702 |
| Fourth signal output 17 ($Q_o^+$) | 714 | 713 | 712 | 711 |

| | Scaling circuits coupled to specified signal input in specified period | | | |
|---|---|---|---|---|
| | $\Phi_{12}$ | $\Phi_{23}$ | $\Phi_{34}$ | $\Phi_{41}$ |
| First signal input 10 | 814 | 813 | 812 | 811 |
| Second signal input 11 | 803 | 804 | 801 | 802 |
| Third signal input 12 | 812 | 811 | 814 | 813 |
| Fourth signal input 13 | 801 | 802 | 803 | 804 |

| Period | $I_o^-$ | | $I_o^+$ | | $Q_o^+$ | | $Q_o^-$ | |
|---|---|---|---|---|---|---|---|---|
| | Sample-and-hold circuit | Scaling circuit | Sample-and-hold circuit | Scaling circuit | Sample-and-hold circuit | Scaling circuit | Sample-and-hold circuit | Scaling circuit |
| $\Phi_1$ | 20A-S | 701 | 30A-S | 712 | 50A-S | 714 | 40A-S | 703 |
| | 30B-H | 704 | 20B-H | 713 | 40B-H | 711 | 50B-H | 702 |
| $\Phi_2$ | 30B-S | 702 | 20B-S | 711 | 40B-S | 713 | 50B-S | 704 |
| | 20A-H | 701 | 30A-H | 712 | 50A-H | 714 | 40A-H | 703 |
| $\Phi_3$ | 20A-S | 703 | 30A-S | 714 | 50A-S | 712 | 40A-S | 701 |
| | 30B-H | 702 | 20B-H | 711 | 40B-H | 713 | 50B-H | 704 |
| $\Phi_4$ | 30B-S | 704 | 20B-S | 713 | 40B-S | 711 | 50B-S | 702 |
| | 20A-H | 703 | 30A-H | 714 | 50A-H | 712 | 40A-H | 701 |

FIG. 12

| Period | $Q_f^+$ | | $Q_f^-$ | | $I_f^+$ | | $I_f^-$ | |
|---|---|---|---|---|---|---|---|---|
| | Sample-and-hold circuit | Scaling circuit | Sample-and-hold circuit | Scaling circuit | Sample-and-hold circuit | Scaling circuit | Sample-and-hold circuit | Scaling circuit |
| $\Phi_1$ | 50A-S | 814 | 40A-S | 803 | 30A-S | 812 | 20A-S | 801 |
| | 40B-H | 811 | 50B-H | 802 | 20B-H | 813 | 30B-H | 804 |
| $\Phi_2$ | 40B-S | 813 | 50B-S | 804 | 20B-S | 811 | 30B-S | 802 |
| | 50A-H | 814 | 40A-H | 803 | 30A-H | 812 | 20A-H | 801 |
| $\Phi_3$ | 50A-S | 812 | 40A-S | 801 | 30A-S | 814 | 20A-S | 803 |
| | 40B-H | 813 | 50B-H | 804 | 20B-H | 811 | 30B-H | 802 |
| $\Phi_4$ | 40B-S | 811 | 50B-S | 802 | 20B-S | 813 | 30B-S | 804 |
| | 50A-H | 812 | 40A-H | 801 | 30A-H | 814 | 20A-H | 803 |

SWITCHED-CURRENT INTEGRATOR

TECHNICAL FIELD

The present invention relates to a switched-current integrator suitable for use in, for example, a complex channel filter for a radio receiver, and to apparatus comprising such an integrator.

BACKGROUND ART

The low-IF architecture is an attractive architecture for an integrated radio receiver as it enables a high level of integration of the channel filter. The frequency response of the channel filter for a low-IF receiver must be non-symmetrical about zero frequency by being capable of rejecting image frequencies and therefore a complex polyphase filter, having in-phase and quadrature-phase inputs and outputs, is required. See, for example, "A Low-IF, Polyphase Receiver for DECT", B. J. Minnis et al, pp. I-60 to I-63, IEEE Int. Symposium on Circuits and Systems, May 28–31, 2000. Furthermore, differential inputs and outputs are desirable to provide protection from impulsive noise.

A basic building block for designing a filter is an integrator; see, for example "Top-down design of a switched-current video filter", J. B. Hughes, pp. 73–81, IEE Proc. Circuits Devices Syst, Vol 147, No. 1, February 2000. It is well known that a bilinear form of integrator has performance advantages over other forms of integrator.

In order to reduce cost, it is desirable to implement a radio receiver or transceiver in a CMOS integrated circuit (IC). In such a receiver or transceiver, analogue and digital circuits are implemented in the same integrated circuit, rather than in separate integrated circuits produced by separate processes. As CMOS component dimensions are reduced to achieve higher levels of integration, the required supply voltage also reduces. Switched-current sampled analogue circuits are well suited to such a scenario as they offer a low power consumption and are able to perform well at low voltages.

Therefore there is a requirement for a complex switched-current bilinear integrator having differential inputs and outputs. A real switched-current bilinear integrator having differential inputs and outputs is disclosed in patent application EP 94306540.9, but not a complex version.

When designing circuits for processing complex signals a high level of matching between the in-phase (I) and quadrature-phase (Q) signal paths is normally required. Mismatch between in-phase and quadrature-phase signal paths in a polyphase filter will constrain the image rejection performance. Therefore there is a requirement for a complex switched-current bilinear integrator with protection from mismatch between signal paths.

One known technique that can be use to compensate for mismatch between signal paths is dynamic element matching (DEM) in which circuit elements are dynamically exchanged between signal paths so that different signal paths experience the same average circuit properties. See, for example "A Quadrature Data-Dependent DEM Algorithm to Improve Image Rejection of a Complex $\Sigma\Delta$ Modulator", L. C. Breems et al, 2001 IEEE Int. Solid State Circuits Conf., paper 3.3. The use of dynamic element matching for a switched-current integrator has been suggested in patent U.S. Pat. No. 5,059,832 but in that patent no practical implementation was disclosed and no consideration was given to the problems that might arise in applying dynamic element matching to switched-current circuits.

DISCLOSURE OF INVENTION

It is an object of the invention to provide a complex switched-current bilinear integrator having protection against the effects of mismatch between in-phase and quadrature phase signal paths.

According to a first aspect of the invention there is provided a complex switched-current bilinear integrator comprising, first and second inputs for a differential pair of in-phase input signals, third and fourth inputs for a differential pair of quadrature-phase input signals, first and second outputs for a differential pair of in-phase output signals, third and fourth outputs for a differential pair of quadrature-phase output signals, coupling the inputs and outputs an arrangement of sample-and-hold circuits and coupled scaling circuits, and means for dynamic element matching whereby at least some of the scaling circuits are interchanged according to a predetermined switching sequence and whereby a change of scaling circuit coupled to any of the sample-and-hold circuits occurs at the beginning of a sampling operation by that sample-and-hold circuit.

The invention is based on the realisation that, when applied to switched-current circuits, dynamic element matching can result in cross-talk between signals in different signal paths. The cross-talk is due to the inherent capacitative nature of switched-current circuit elements which results in a stored portion of signal being transferred between signal paths when circuit elements are dynamically interchanged between signal paths.

The invention is further based on the realisation that, in an integrator circuit employing sample-and-hold circuits, cross-talk between signal paths can be avoided if circuit elements coupled to the sample-and-hold circuit are interchanged only at the beginning of the sampling operation.

The invention is further based on the realisation that a complex bilinear integrator can be implemented as a pair of cross-coupled real bilinear integrators.

The invention is further based on the realisation that, by employing pairs of sample-and-hold circuits alternately sampling and alternately holding thereby providing continuous integration, a four state switching sequence encompassing two sample-and-hold cycles of each sample-and-hold circuit can be devised to average the performance of circuit elements in four signal paths constituting differential pairs of in-phase and quadrature-phase signal paths in a way that prevents mixing of in-phase and quadrature-phase signals.

The present invention also relates to apparatus comprising a complex switched-current bilinear integrator in accordance with the first aspect of the invention.

The present invention also relates to a filter comprising the complex switched-current bilinear integrator in accordance with the first aspect of the present invention.

The present invention further relates to a radio receiver including a filter comprising the complex switched-current bilinear integrator in accordance with the first aspect of the present invention.

The present invention further relates to an integrated circuit embodying the complex switched-current bilinear integrator in accordance with the first aspect of the present invention, or embodying the filter comprising the complex switched-current bilinear integrator in accordance with the first aspect of the present invention, or embodying the receiver including a filter comprising the complex switched-current bilinear integrator in accordance with the first aspect of the present invention.

BRIEF DESCRIPTION OF DRAWINGS

The invention will now be described, by way of example only, with reference to the accompanying drawings wherein:

FIG. 8 is a tabulation of couplings made by the second switching means, FIG. 10 is a tabulation of couplings made by the third and the fourth switching means, FIG. 11 is a tabulation of the derivation of output signal currents $I_o^-$, $I_o^+$, $Q_o^-$ and $Q_o^+$ during periods $\Phi_1$, $\Phi_2$, $\Phi_3$ and $\Phi_4$, FIG. 12 is a tabulation of the derivation of feedback currents $Q_f^+$, $Q_f^-$, $I_f^+$ and $I_f^-$ during periods $\Phi_1$, $\Phi_2$, $\Phi_3$ and $\Phi_4$.

MODES FOR CARRYING OUT THE INVENTION

Figure 13:
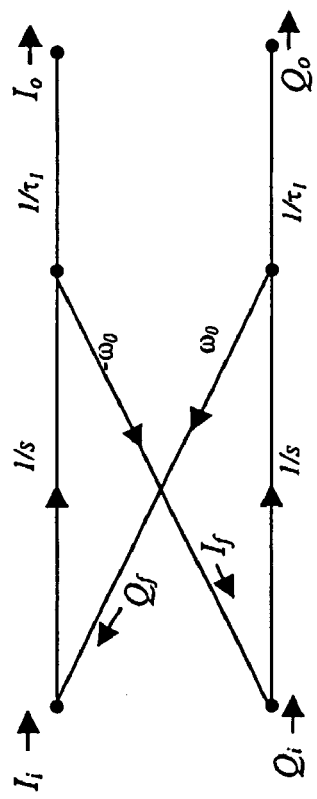
FIG. 13 is an s-domain signal flow graph for a complex integrator.

An s-domain signal flow graph of a complex integrator is illustrated in FIG. 13 and comprises in-phase (I) and quadrature-phase (Q) forward paths. In the in-phase forward path, an in-phase input signal $I_i$ and a quadrature-phase feedback signal $Q_f$ are integrated by application of a factor $1/s$; the integrated signal is then scaled by a factor $1/\tau_1$ to provide an output in-phase signal $I_o$; also the integrated signal is scaled by a factor $-\omega_0$ to provide an in-phase feedback signal $I_f$. In the quadrature-phase forward path, a quadrature-phase input signal $Q_i$ and the in-phase feedback signal $I_f$ are integrated by application of a factor $1/s$; the integrated signal is then scaled by a factor $1/\tau_1$ to provide an output quadrature-phase signal $Q_o$; also the integrated signal is scaled by a factor $\omega_0$ to provide the quadrature-phase feedback signal $Q_f$. $\tau_1$ is the integrator time constant and $\omega_0$ is the pole frequency of the integrator, in radians. The transfer function for each of the in-phase (I) and quadrature-phase (Q) signal paths is $$H(s) = \frac{1}{(s - j\omega_0)\tau_1}.$$

Figure 14:
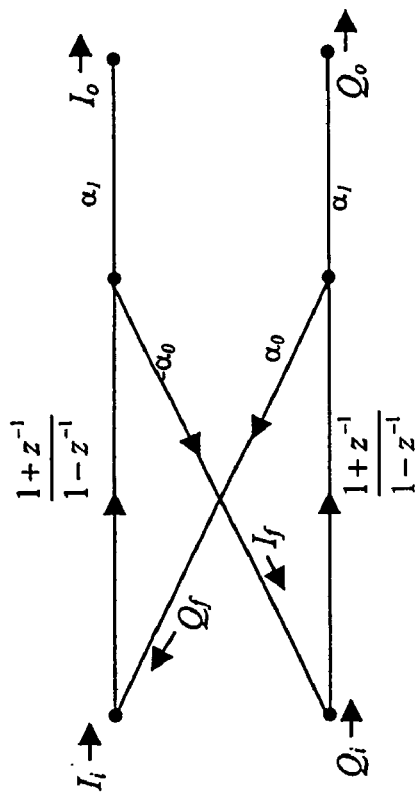
FIG. 14 is a z-domain signal flow graph for a complex bilinear integrator.

Applying the bilinear z-transform:

$$s \Rightarrow \frac{2}{T} \cdot \frac{1 - z^{-1}}{1 + z^{+1}}$$

and setting $$\alpha_1 = \frac{T}{2\tau_1} \text{ and } \alpha_0 = \frac{\omega_0 T}{2},$$

where T is a sampling interval, results in the signal flow graph illustrated in FIG. 14. Each forward path in FIG. 14 has the form of a real bilinear integrator comprising an integration stage and an output stage which scales the integrated signals by a factor $\alpha_1$. Therefore a complex bilinear integrator can be implemented as a pair of real bilinear integrators with cross-coupling of the integrated signals respectively scaled by factors $-\alpha_0$ and $\alpha_0$. In order to incorporate differential signal paths, two such pairs of cross-coupled real bilinear integrators with scaling circuits are used. The inversion required to apply the scale factor $-\alpha_0$ is provided by interchanging the positive and negative differential feedback paths.

Figure 1:
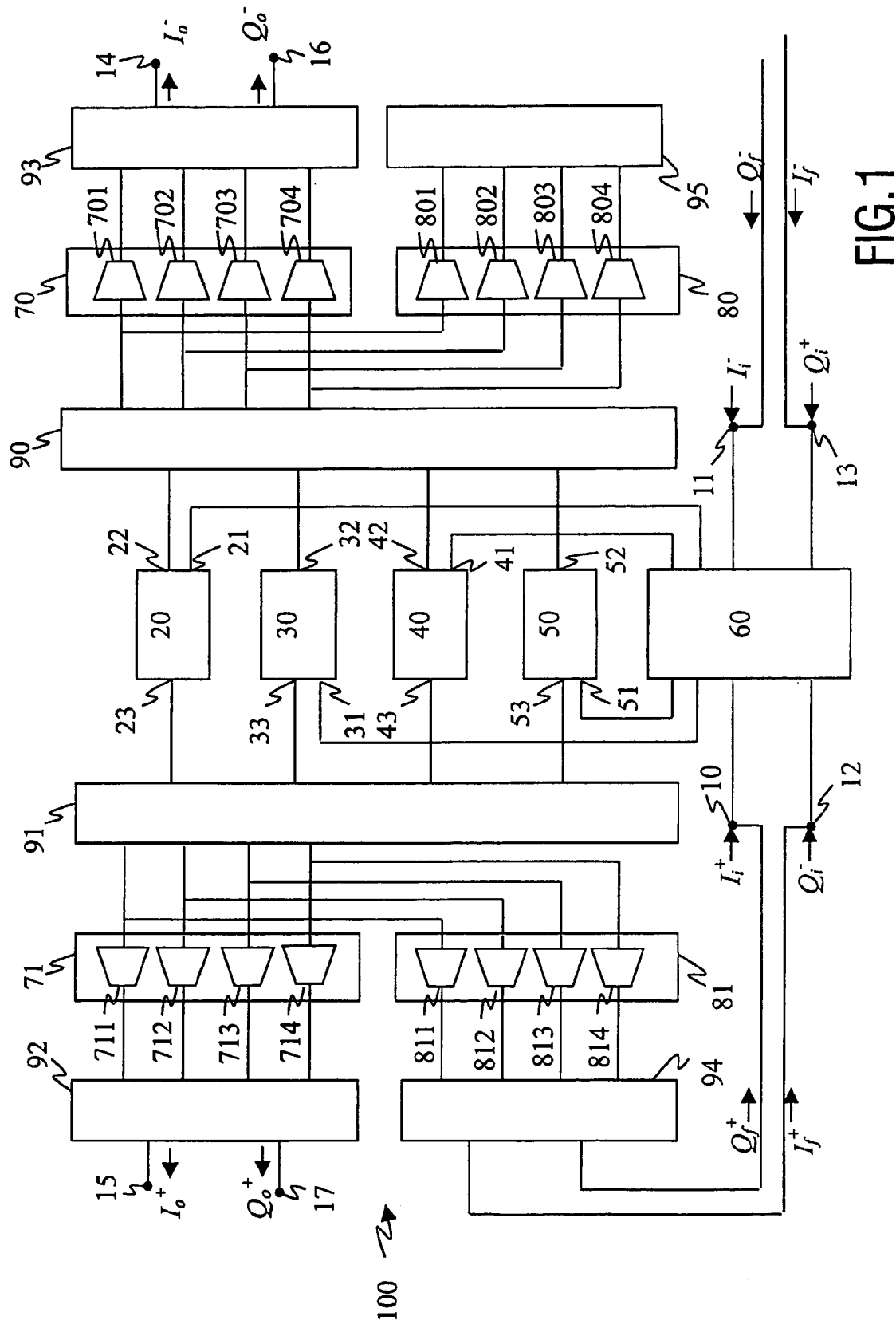
FIG. 1 is schematic circuit diagram of a complex switched-current bilinear integrator with dynamic element matching.

Referring to FIG. 1 there is illustrated a complex switched-current bilinear integrator with dynamic element matching (DEM) 100 having first and second signal inputs 10, 11 for a differential pair of in-phase input signal currents ($I_i^+$, $I_i^-$), and third and fourth signal inputs 12, 13 for a differential pair of quadrature-phase input signal currents ($Q_i^-$, $Q_i^+$), first and second signal outputs 14, 15 for delivering a differential pair of integrated in-phase output signal currents ($I_o^-$, $I_o^+$), and third and fourth signal outputs 16, 17 for delivering a differential pair of integrated quadrature-phase output signal currents ($Q_o^-$, $Q_o^+$). The currents of each differential pair are equal and opposite in direction, i.e. $I_i^+=-I_i^-=I_i$, $Q_i^+=-Q_i^-=Q_i$, $I_o^+=-I_o^-=I_o$ and $Q_o^+=-Q_o^-=Q_o$.

Figure 2:
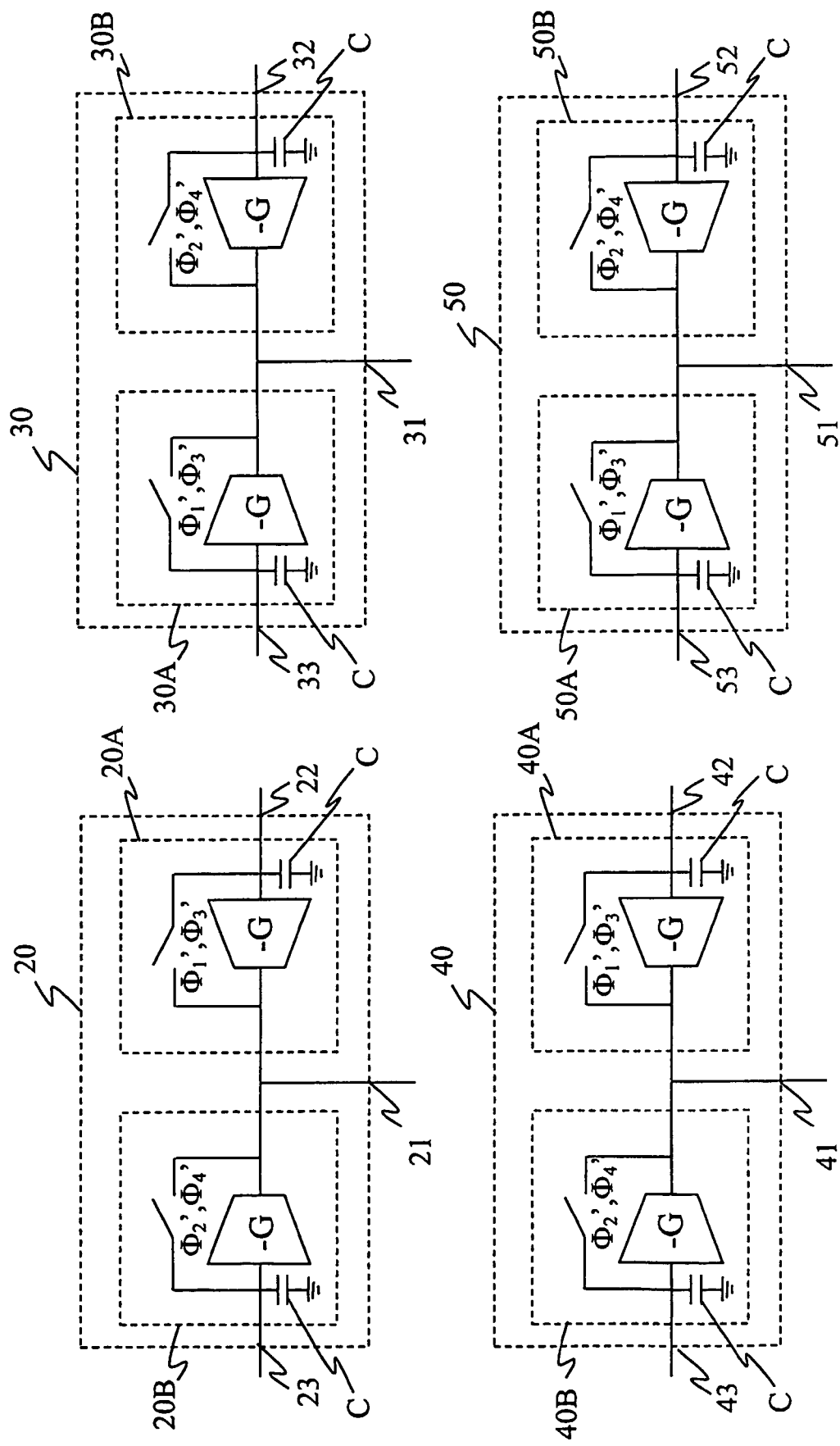
FIG. 2 is a schematic diagram of integrator core-circuits.

The complex switched-current bilinear integrator with DEM 100 comprises first, second, third and fourth integrator core-circuits 20, 30, 40, 50. Each integrator core-circuit 20, 30, 40, 50 comprises a first and a second switched-current sample-and-hold circuit 20A and 20B, 30A and 30B, 40A and 40B, 50A and 50B as illustrated in FIG. 2, respective inputs 21, 31, 41, 51 common to the pair of first and second switched-current sample-and-hold circuits, respective first outputs 22, 32, 42, 52 of the respective first switched-current sample-and-hold circuits 20A, 30A, 40A, 50A, and respective second outputs 23, 33, 43, 53 of the respective second switched-current sample-and-hold circuits 20B, 30B, 40B, 50B.

Figure 4:
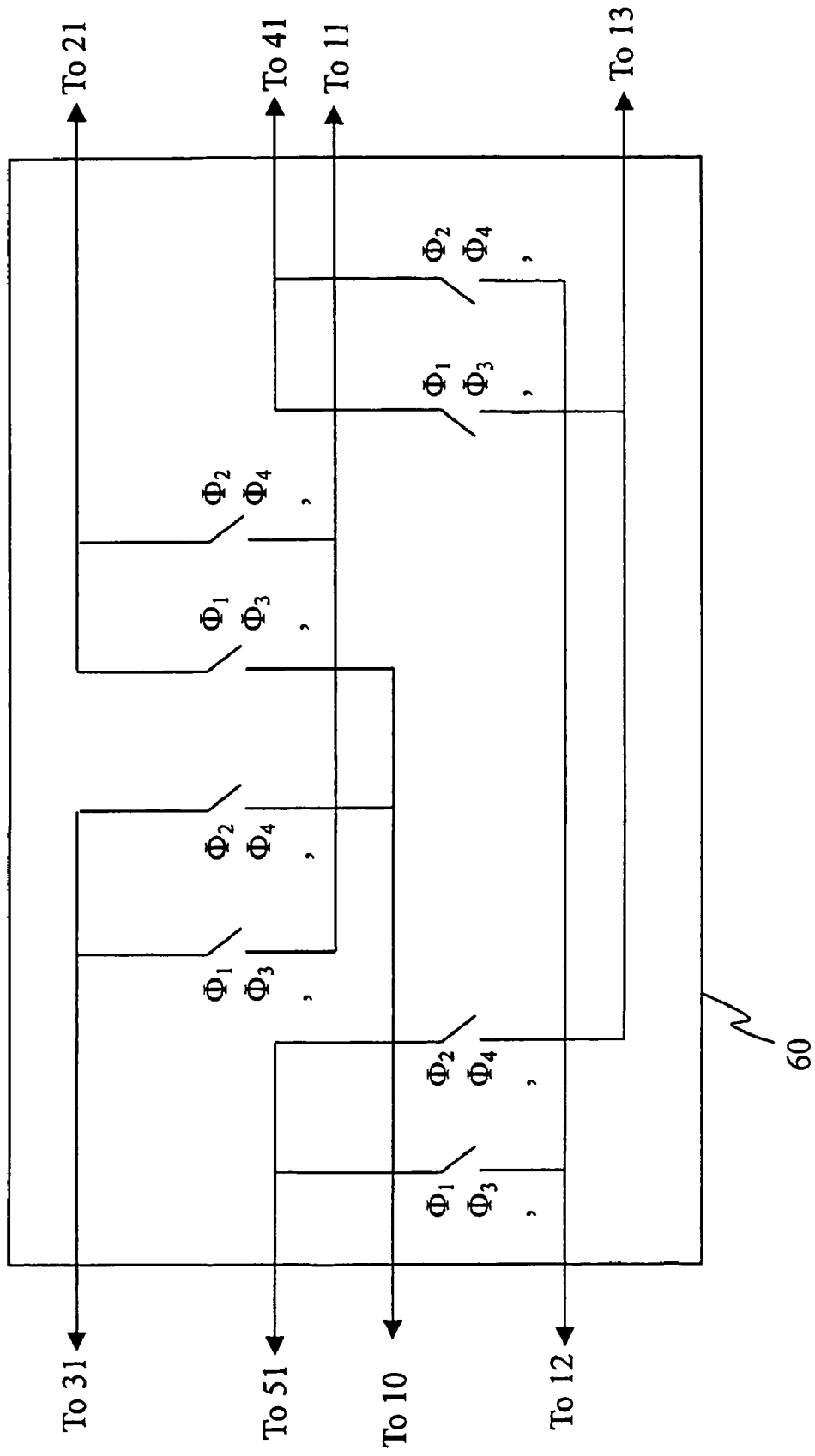
FIG. 4 is a schematic diagram of a first switching means.
Figure 5:
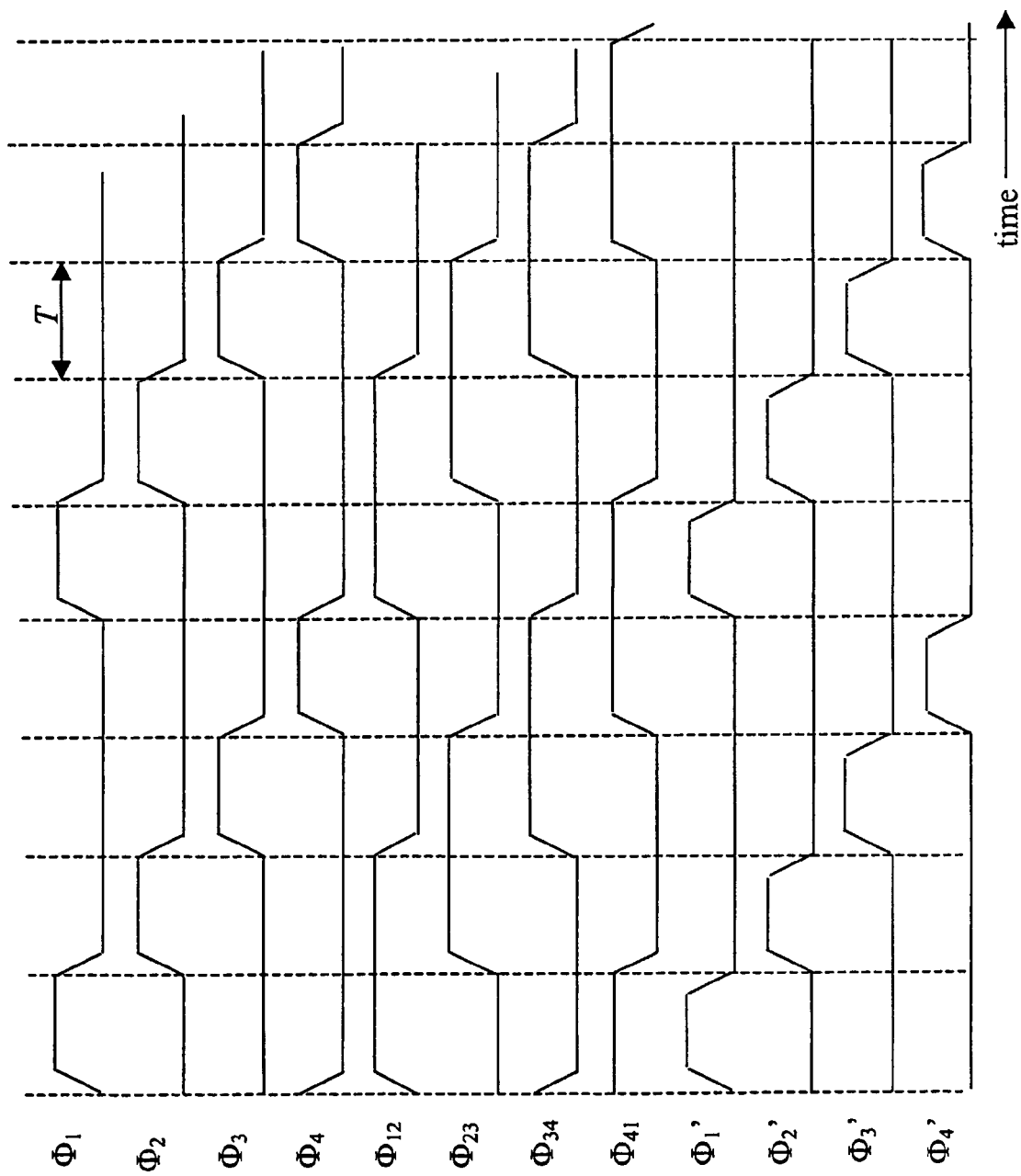
FIG. 5 is a timing diagram showing a repeating switching sequence.

The complex switched-current bilinear integrator with DEM 100 has a first switching means 60, illustrated in detail in FIG. 4, which operates in accordance with the predetermined repeating switching sequence illustrated in FIG. 5 having consecutive periods $\Phi_1$, $\Phi_2$, $\Phi_3$, $\Phi_4$, to couple at periods $\Phi_1$ and $\Phi_3$:

the first signal input 10 to the first integration core-circuit input 21, the second signal input 11 to the second integration core-circuit input 31, the third signal input 12 to the fourth integration core-circuit input 51, and the fourth signal input 13 to the third integration core-circuit input 41, and at periods $\Phi_2$ and $\Phi_4$:

the first signal input 10 to the second integration core-circuit input 31, the second signal input 11 to the first integration core-circuit input 21, the third signal input 12 to the third integration core-circuit input 41, and the fourth signal input 13 to the fourth integration core-circuit input 51.

The periods $\Phi_1$, $\Phi_2$, $\Phi_3$ and $\Phi_4$ are consecutive periods of duration T. The transition times of each period $\Phi_1$, $\Phi_2$, $\Phi_3$, $\Phi_4$ are exaggerated in FIG. 5 and overlap the rise and fall time of the adjacent periods $\Phi_1$, $\Phi_2$, $\Phi_3$ or $\Phi_4$ to provide continuous coupling of the signal inputs 10, 11, 12, 13 to the integrator core-circuits 20, 30, 40, 50.

Figure 3:
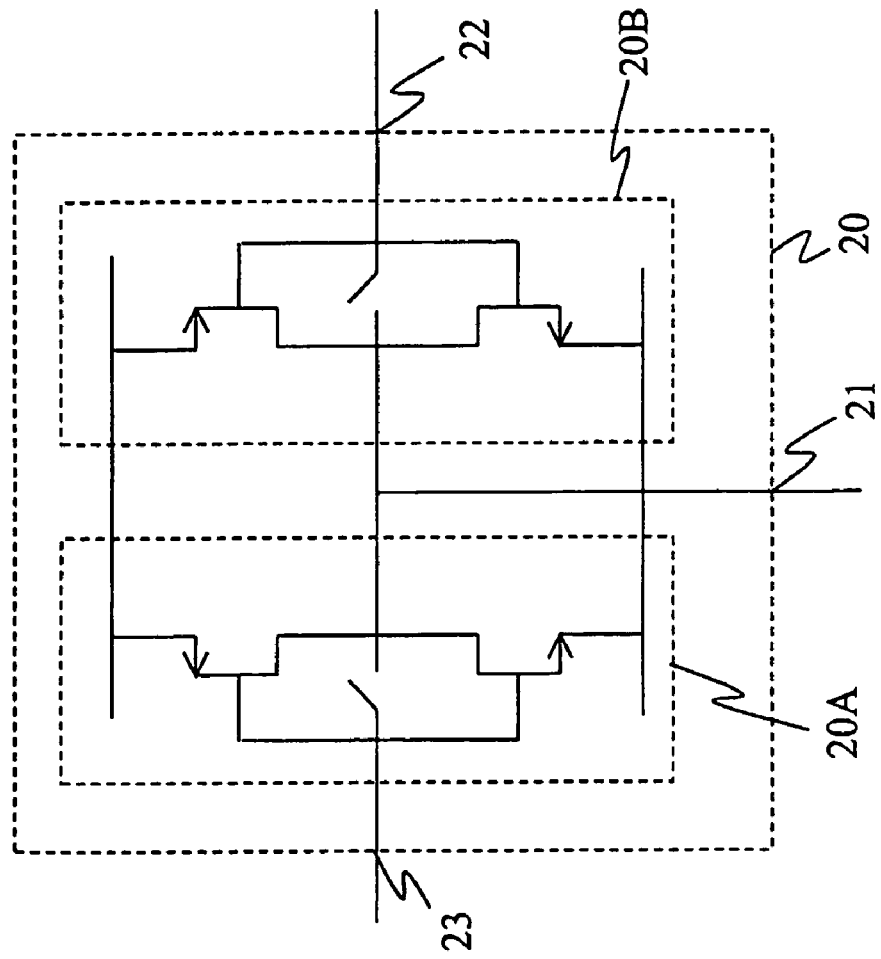
FIG. 3 is a circuit diagram of an integrator core-circuit.

Referring to FIG. 2, the first integrator core-circuit 20 will be described, the second, third and fourth integrator core-circuits 30, 40, 50 having an identical structure. Each switched-current sample-and-hold circuit 20A and 20B comprises a transconductor having a transconductance –G, a sampling switch coupled between the input and output of the transconductor, and a capacitor coupled to the input of the transconductor. The transconductor is implemented as a NMOS/PMOS transistor pair forming a class AB memory cell with the connected drains coupled to the input 21 and the connected gates coupled to respectively either the first or second output, 22 or 23, as illustrated in FIG. 3. Alternative transconductor configurations could be used. The sampling switch is implemented physically with an MOS transistor. The capacitor is implemented physically using the parasitic capacitance of the circuit, especially gate capacitance, and, if necessary, an additional explicit capacitor. The switched-current sample-and-hold circuits 20A and 20B alternately perform a sampling operation. For the sampling operation of the switched-current sample-and-hold circuit 20A or 20B, the sampling switch is closed, current flows at the input 21 and between the holding circuit and the sampling circuit, and this current flows initially in the gates of the respective transconductor. The gate current results in the gate capacitance of the transistors of the respective transconductors being charged thereby increasing the gate voltage at the respective output, 22 or 23. As a result the drains begin to conduct the current and current ceases to flow in the gates, leaving the gate capacitance charged. In this state the respective sample-and-hold circuit 20A or 20B has performed integration by sampling the combined input current and held current of the opposite sample-and-hold circuit 20A or 20B. When not performing a sampling operation, the switched-current sample-and-hold circuits 20A and 20B perform a holding operation. For the holding operation the respective sampling switch is open and the gate voltage is held at the respective output, 22 or 23, thereby holding the previously sampled drain current. The duration of each sampling operation and each holding operation is T. The first and second switched-current sample-and-hold circuits 20A, 20B provide continuous sampling by alternately sampling and alternately holding. When one of the switched-current sample-and-hold circuits 20A, 20B is holding the other is sampling the sum of the held current and the current flowing at the input 21. In this way the current flowing at the input 21 is integrated. Each time the first and second switched-current sample-and-hold circuits 20A, 20B swap the roles of integrating and holding, the current flowing at the input 21 is required to reverse direction.

The sampling switches in each integrator core-circuit 20, 30, 40, 50 operate in accordance with the switching sequence illustrated in FIG. 5 such that in consecutive periods $\Phi 1'$, $\Phi_2'$, $\Phi_3'$, $\Phi_4'$, each of duration slightly less than T, the following sequence of states is established:

In periods $\Phi hd 1'$ and $\Phi_3'$ the first switched-current sample-and-hold circuits 20A, 30A, 40A and 50A are sampling and the second switched-current sample-and-hold circuits 20B, 30B, 40B and 50B are holding;

In periods $\Phi hd 2'$ and $\Phi_4'$ the first switched-current sample-and-hold circuits 20A, 30A, 40A and 50A are holding and the second switched-current sample-and-hold circuits 20B, 30B, 40B and 50B are sampling.

In FIG. 5 a high level in the switching sequence corresponds to a closed switch and a low level corresponds to an open switch. The transition times in the switching sequence are exaggerated. In particular, in each integration core-circuit 20, 30, 40, 50 the sampling operation of each switched-current sample-and-hold circuit in the period $\Phi_1'$, $\Phi_2'$, $\Phi_3'$ or $\Phi_4'$ terminates before the input current delivered to that switched-current sample-and-hold circuit is interrupted by the first switching means at the end of the corresponding period $\Phi_1$, $\Phi_2$, $\Phi_3$, or $\Phi_4$, thereby ensuring accurate sampling.

The switching operations described above for the first switching means 60 are synchronous with the commencement of the sampling operations of the integrator core-circuits 20, 30, 40, 50 such that swapping the currents of each differential pair of signal currents, i.e. swapping $I_i^-$ and $I_i^+$ and swapping $Q_i^-$ and $Q_i^+$, enables continuous integration of the input signal currents $I_i^-$, $I_i^+$, $Q_i^-$ and $Q_i^+$.

Coupled to the first and second outputs 22, 32, 42, 52, 23, 33, 43, 53 of the integration core-circuits 20, 30, 40, 50 is a first arrangement of scaling circuits, comprising 70 and 71 in FIG. 1, which apply a first scale factor $\alpha_1$ to signals delivered at these outputs. The first arrangement of scaling circuits 70, 71 comprises eight such scaling circuits 701, 702, 703, 704, 711, 712, 713, 714 which are implemented as transconductors having transconductance $-\alpha_1 G$.

Also coupled to the first and second outputs 22, 32, 42, 52, 23, 33, 43, 53 of the integration core-circuits 20, 30, 40, 50 is a second arrangement of scaling circuits, comprising 80 and 81 in FIG. 1, which apply a second scale factor $\alpha_0$ to signals delivered at these outputs. The second arrangement of scaling circuits, 80, 81 comprises eight such scaling circuits 801, 802, 803, 804, 811, 812, 813, 814 which are implemented as transconductors having transconductance $-\alpha_0 G$.

Figure 6:
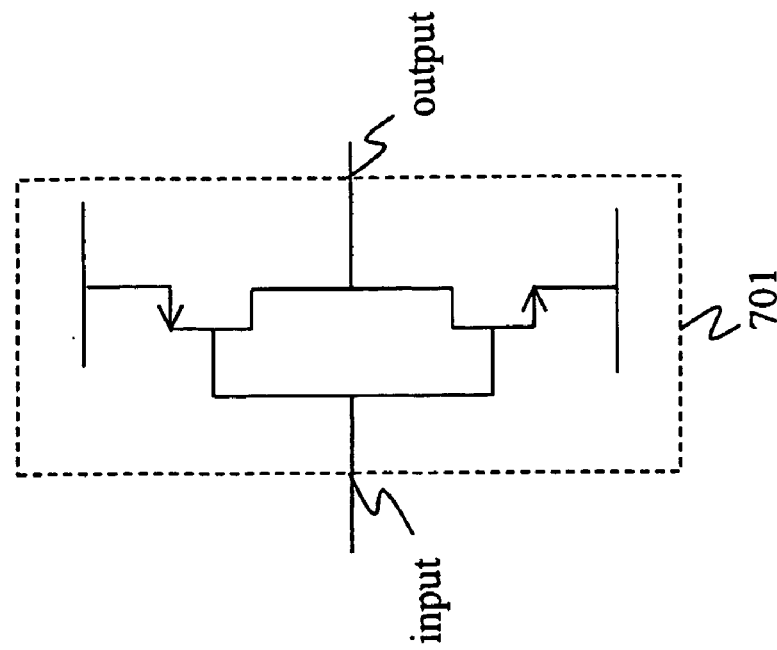
FIG. 6 is a circuit diagram of a scaling circuit.

Each transconductor of the first and second arrangements of scaling circuits 70, 71, 80, 81 is implemented as an NMOS/PMOS transistor pair with an input at their connected gates and an output at their connected drains, as illustrated in FIG. 6 for scaling circuit 701. The scale factors $\alpha_1$ and $\alpha_0$ are determined by the width/length ratio of the transistors in the scaling circuits. Alternative transconductor configurations could be used for the scaling circuits 70, 71, 80, 81, as for the switched-current sample-and-hold circuits 20A, 20B, 30A, 30B, 40A, 40B, 50A, 50B.

Figure 7:
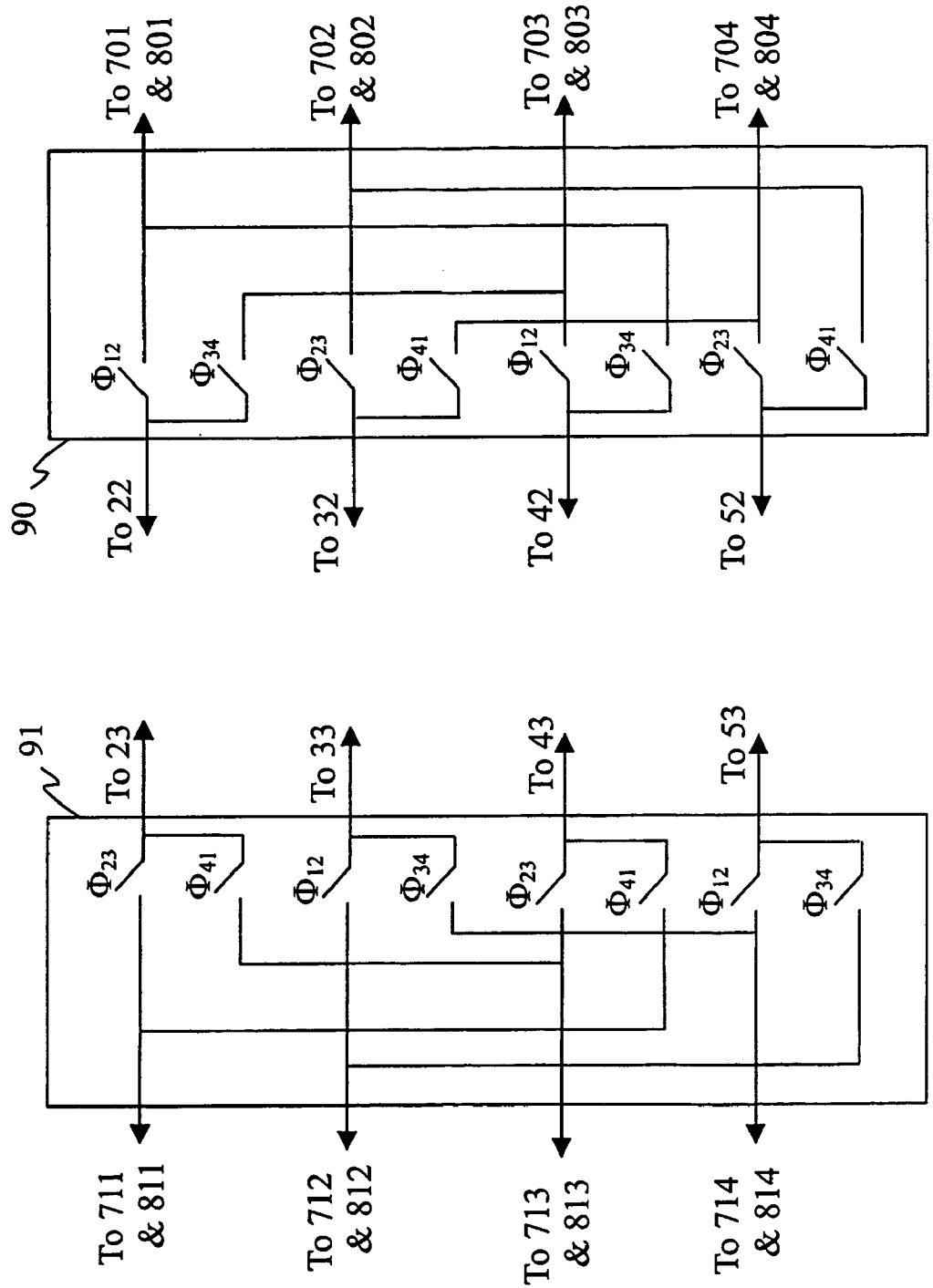
FIG. 7 is schematic diagram of a second switching means.

Coupling of the first and second outputs 22, 32, 42, 52, 23, 33, 43, 53 of the integration core-circuits 20, 30, 40, 50 to the first and second arrangements of scaling circuits 70, 71, 80, 81 is by means of a second switching means, comprising 90 and 91 in FIG. 1, which operates in accordance with the switching sequence illustrated in FIG. 5 to make the couplings tabulated in FIG. 8 and indicated in FIG. 7 at times $\Phi_{12}$, $\Phi_{23}$, $\Phi_{34}$ and $\Phi_{41}$ which are defined by the relationships; $\Phi_{12}=\Phi_1+\Phi_2$, $\Phi_{23}=\Phi_2+\Phi_3$, $\Phi_{34}=\Phi_3+\Phi_4$, and $\Phi_{41}=\Phi_4+\Phi_1$. For each of the first and second switched-sample-and-hold circuits 20A, 20B, 30A, 30B, 40A, 40B, 50A, 50B a change of coupled scaling circuit occurs only at the beginning of a period of sampling, and so the same scaling circuit is retained throughout that sampling period and the following holding period.

Figure 9:
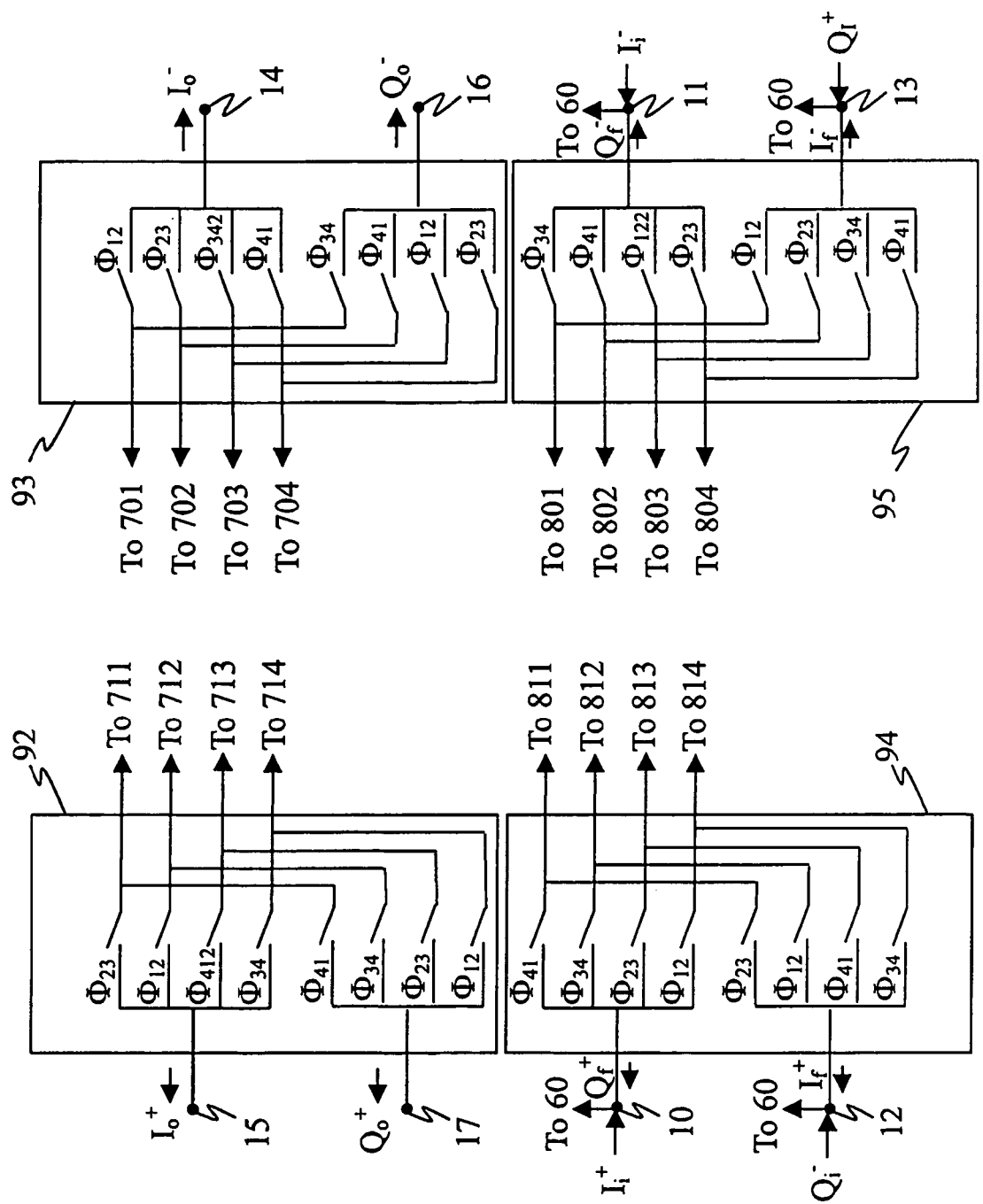
FIG. 9 is schematic diagram of a third and a fourth switching means.

The first, second, third and fourth signal outputs 14, 15, 16, 17 are coupled to the first arrangement of scaling circuits 70, 71 by means of a third switching means, comprising 92, 93 in FIG. 1, which operates in accordance with the switching sequence illustrated in FIG. 5 to make the couplings tabulated in FIG. 10 and indicated in FIG. 9 at times $\Phi_{12}$, $\Phi_{23}$, $\Phi_{34}$ and $\Phi_{41}$.

The combined result of the operation of the second and third switching means 90, 91, 92, 93 is to derive output signal currents $I_o^-$, $I_o^+$, $Q_o^-$ and $Q_o^+$ during periods $\Phi_1$, $\Phi_2$, $\Phi_3$ and $\Phi_4$, from the switched-current sample-and-hold circuits 20A, 20B, 30A, 30B, 40A, 40B, 50A, 50B and scaling circuits 701–704 and 711–714 as tabulated in FIG. 11. In FIG. 11, the suffix—S is included after the reference numeral of a switched-current sample-and-hold circuit to indicate that the switched-current sample-and-hold circuit is sampling, and the suffix –H indicates that the switched-current sample-and-hold circuit is holding. For each of the periods $\Phi_1$, $\Phi_2$, $\Phi_3$ and $\Phi_4$, each of the in-phase output signal currents $I_o^-$, $I_o^+$ is the sum of a current drawn from the first and second integrator core-circuits 20, 30 and scaled by the first arrangement of scaling circuits 70, 71, with $I_o^-$ scaled by 70 and $I_o^+$ scaled by 71, and each of the quadrature-phase output signal currents $Q_o^-$, $Q_o^+$ is the sum of a current drawn from the third and fourth integrator core-circuits 40, 50 and scaled by the first arrangement of scaling circuits 70, 71, with $Q_o^-$ scaled by 70 and $Q_o^+$ scaled by 71. Over the complete sequence of four periods $\Phi_1$, $\Phi_2$, $\Phi_3$ and $\Phi_4$, each of the output signal currents $I_o^-$ and $Q_o^-$ is scaled by all four scaling circuits 701, 702, 703, 704 in part 70 of the first arrangement of scaling circuits 70, 71 for an equal period of time T, and each of the output signal currents $I_o^+$ and $Q_o^+$ is scaled by all four scaling circuits 711, 712, 713, 714 in part 71 of the first arrangement of scaling circuits 70, 71 for an equal period of time T. Therefore, the effects of mismatch in the group of four scaling circuits 701 to 704 is averaged for $I_o^-$ and $Q_o^-$ over the complete sequence $\Phi_1$, $\Phi_2$, $\Phi_3$ and $\Phi_4$, and the effects of mismatch in the group of four scaling circuits 711 to 714 is averaged for $I_o^+$ and $Q_o^+$ over the complete sequence $\Phi_1$, $\Phi_2$, $\Phi_3$ and $\Phi_4$. Stated differently, each of the output signal currents $I_o^-$ and $Q_o^-$ experiences the same average of four values of the first scaling factor $\alpha_1$ and each of the output signal currents $I_o^+$ and $Q_o^+$ experiences the same average of a different four values of the first scaling factor $\alpha_1$. The differential output signal currents $I_o^+ - I_o^-$ and $Q_o^+ - Q_o^-$ are both averaged over all eight scaling circuits of the first arrangement of scaling circuits 70, 71.

Because the first and second integrator core-circuits 20, 30 supply only the in-phase output signal currents ($I_o^-$, $I_o^+$) and the third and fourth integrator core-circuits 40, 50 supply only the quadrature-phase output signal currents ($Q_o^-$, $Q_o^+$), signals stored in the integrator core-circuits 20, 30, 40, 50 are not transferred between the in-phase and quadrature signal paths.

The second arrangement of scaling circuits 80, 81 provides first, second, third and fourth feedback currents $Q_f^+$, $Q_f^-$ $I_f^+$, $Q_f^-$ to respectively the first, second, third and fourth signal inputs 10, 11, 12, 13 being coupled by means of a fourth switching means 94, 95 which makes the couplings defined in the table of FIG. 10 and indicated in FIG. 9 at times $\Phi_{12}$, $\Phi_{23}$, $\Phi_{34}$ and $\Phi_{41}$.

The combined result of the operation of the second and fourth switching means 90, 91, 94, 95 is to provide first, second, third and fourth feedback currents $Q_f^+$, $Q_f^-$ $I_f^+$, $I_f^-$ to respectively the first, second, third and fourth signal inputs 10, 11, 12, 13 during periods $\Phi_1$, $\Phi_2$, $\Phi_3$ and $\Phi_4$ from the switched-current sample-and-hold circuits 20A, 20B, 30A, 30B, 40A, 40B, 50A, 50B and scaling circuits 801–804 and 811–814 as tabulated in FIG. 12. In FIG. 12, the suffix—S is included after the reference numeral of a switched-current sample-and-hold circuit to indicate that the switched-current sample-and-hold circuit is sampling, and the suffix –H indicates that the switched-current sample-and-hold circuit is holding. For each of the periods $\Phi_1$, $\Phi_2$, $\Phi_3$ and $\Phi_4$, each of the currents $Q_f^+$, $Q_f^-$ fed back to respectively the first and second signal inputs 10, 11 is the sum of a current drawn from the third and fourth integrator core-circuits 40, 50 and scaled by the second arrangement of scaling circuits 80, 81, with $Q_f^+$ scaled by 81 and $Q_f^-$ scaled by 80, and each of the currents $I_f^+$, $I_f^-$ fed back to respectively the third and fourth signal inputs 12, 13 is the sum of a current drawn from the third and fourth integrator core-circuits 40, 50 and scaled by the second arrangement of scaling circuits 80, 81, with $I_f^+$ scaled by 81 and $I_f^-$ scaled by 80. The currents $Q_f^+$, $Q_f^-$ fed back to respectively the first and second signal inputs 10, 11 are derived from the third and fourth integrator core-circuits 40, 50 which integrate the quadrature-phase input signal currents $Q_i^-$, $Q_i^+$, and the currents $I_f^+$, $I_f^-$ fed back to respectively the third and fourth signal inputs 12, 13 are derived from the first and second integrator core-circuits 20, 30 which integrate the in-phase input signal currents $I_i^-$, $I_i^+$. Therefore there is cross coupling between the in-phase and quadrature phase feedback currents.

Over the complete sequence of four periods $\Phi_1$, $\Phi_2$, $\Phi_3$ and $\Phi_4$, each of the feedback currents $I_f^-$ and $Q_f^-$ is scaled by all four scaling circuits 801, 802, 803, 804 in part 80 of the second arrangement of scaling circuits 80, 81 for an equal period of time T, and each of the feedback currents $I_f^+$ and $Q_f^+$ is scaled by all four scaling circuits 811, 812, 813, 814 in part 81 of the second arrangement of scaling circuits 80, 81 for an equal period of time T. Therefore, the effects of mismatch in the group of four scaling circuits 801 to 804 is averaged for $I_f^-$ and $Q_f^-$ over the complete sequence $\Phi_1$, $\Phi_2$, $\Phi_3$ and $\Phi_4$, and the effects of mismatch in the group of four scaling circuits 811 to 814 is averaged for $I_f^+$ and $Q_f^+$ over the complete sequence $\Phi_1$, $\Phi_2$, $\Phi_3$ and $\Phi_4$. Stated differently, each of the feedback currents $I_f^-$ and $Q_f^-$ experiences the same average of four values of the second scaling factor $\alpha_0$ and each of the feedback currents $I_f^+$ and $Q_f^+$ experiences the same average of a different four values of the second scaling factor $\alpha_0$.

Each of the integrator core-circuits 20, 30, 40, 50 operates in conjunction with those first scaling circuits 701 to 704 that are coupled to the respective integrator core-circuit during any period $\Phi_1$, $\Phi_2$, $\Phi_3$ and $\Phi_4$ to form a real bilinear integrator in each of the periods $\Phi_1$, $\Phi_2$, $\Phi_3$ and $\Phi_4$. These real bilinear integrators, in conjunction with the cross coupling of the feedback currents $I_f^-$, $I_f^+$, $Q_f^-$ and $Q_f^+$ with interchanged positive and negative differential in-phase feedback currents $I_f^-$ and $I_f^+$, form a complex switched-current bilinear integrator in each of the periods $\Phi_1$, $\Phi_2$, $\Phi_3$ and $\Phi_4$. For clarity, this interchanging means that $I_f^+$ sums with $Q_i^-$ at the third signal input 12 and $I_f^-$ sums with $Q_i^+$ at the fourth signal input 13, whereas $Q_f^+$ sums with $I_i^+$ at the first signal input 10 and $Q_f^-$ sums with $I_i^-$ at the second signal input 11.

Optionally alternative forms of integrator core-circuit 20, 30, 40, 50 may be used.

Optionally alternative forms of scaling circuit may be used.

Optionally alternative switching sequences may be used which change the coupling of a scaling circuit to a switched-current sample-and-hold circuit at the beginning of a sampling operation.

Optionally alternative switching sequences may be used which have a repetition period other than four sampling periods, for example eight sampling periods.

Optionally averaging may be performed over a subset of the scaling circuits albeit with possibly a reduced matching performance. For example averaging may be performed over only scaling circuits in the first or second arrangement of scaling circuits 70, 71, 80, 81, or over a subset of scaling circuits within the first or second arrangement of scaling circuits.

Figure 15:
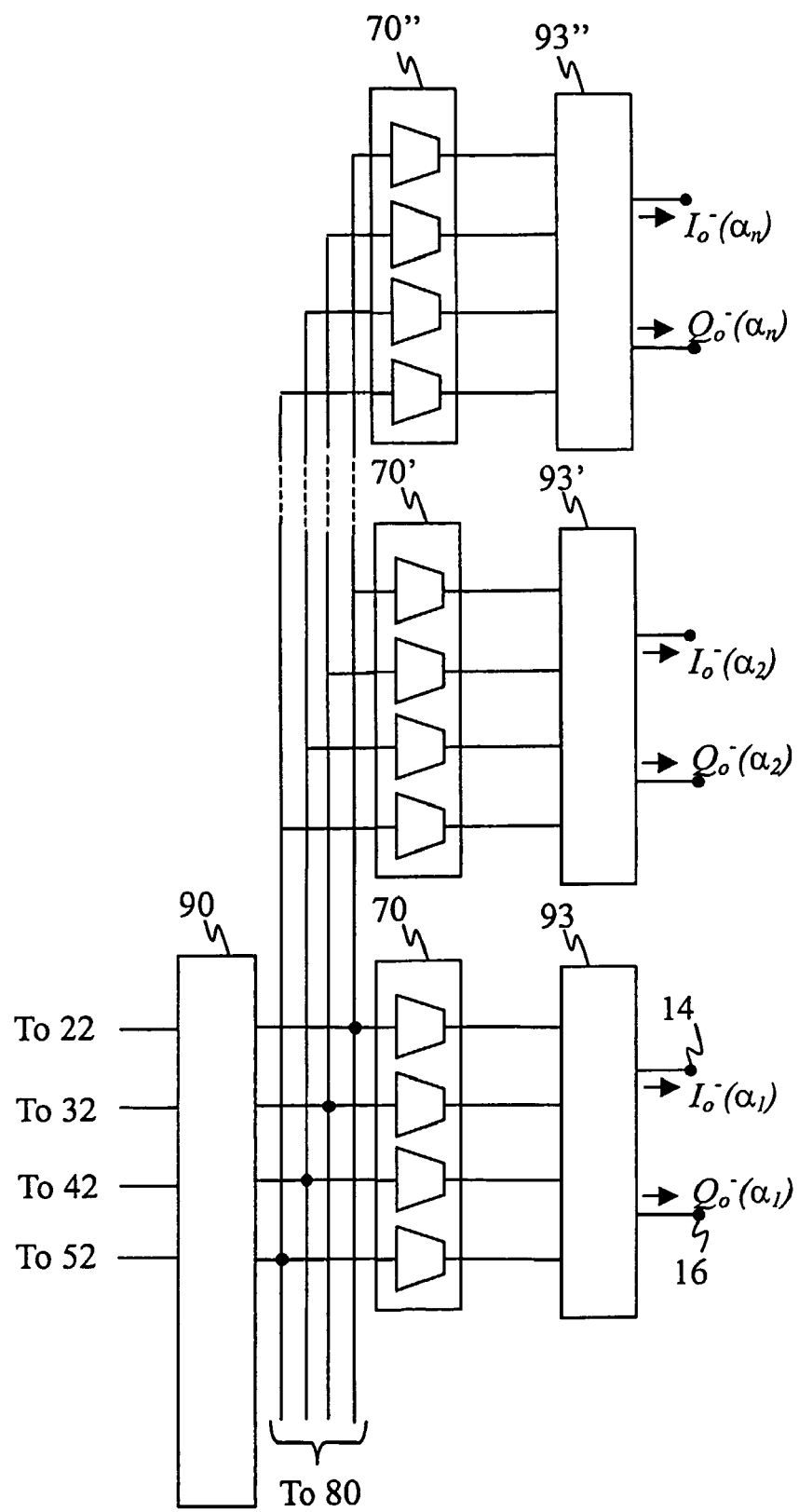
FIG. 15 illustrates implementation of additional scaling factors.

A filter may be constructed from one or more of the complex switched-current bilinear integrators with DEM 100 in accordance with the invention. In such a filter it may be necessary, according to the desired frequency response, to provide additional output signal currents which have been scaled by different values of scale factor. Such additional output signal currents are provided by duplicating, albeit with different scaling factors, the first arrangement of scaling circuits 70, 71, the duplicate also being coupled to the second switching means 90, 91, and a duplicate third switching means 92, 93 coupled to the duplicate first arrangement of scaling circuits 70, 71. FIG. 15 illustrates how output signal currents $I_o^-(\alpha_k)$, $Q_o^-(\alpha_k)$ scaled by different values of scale factor $\alpha_k$, k=1 ... n are derived from the portion 90 of the second switching means 90, 91. Scaling circuits within blocks 70, 70' and 70" are identical apart from the scale factors; block 70 applies a scale factor $\alpha_1$, block 70' applies a scale factor $\alpha_2$, and block 70" applies a scale factor $\alpha_n$. The blocks 93, 93' and 93" are identical. The skilled person will readily recognise that output signal currents $I_o^+(\alpha_k)$, $Q_o^+(\alpha_k)$ scaled by values of scale factor $\alpha_k$, k=1 ... n may be derived from the portion 91 of the second switching means 90, 91 in an equivalent manner.

Figure 16:
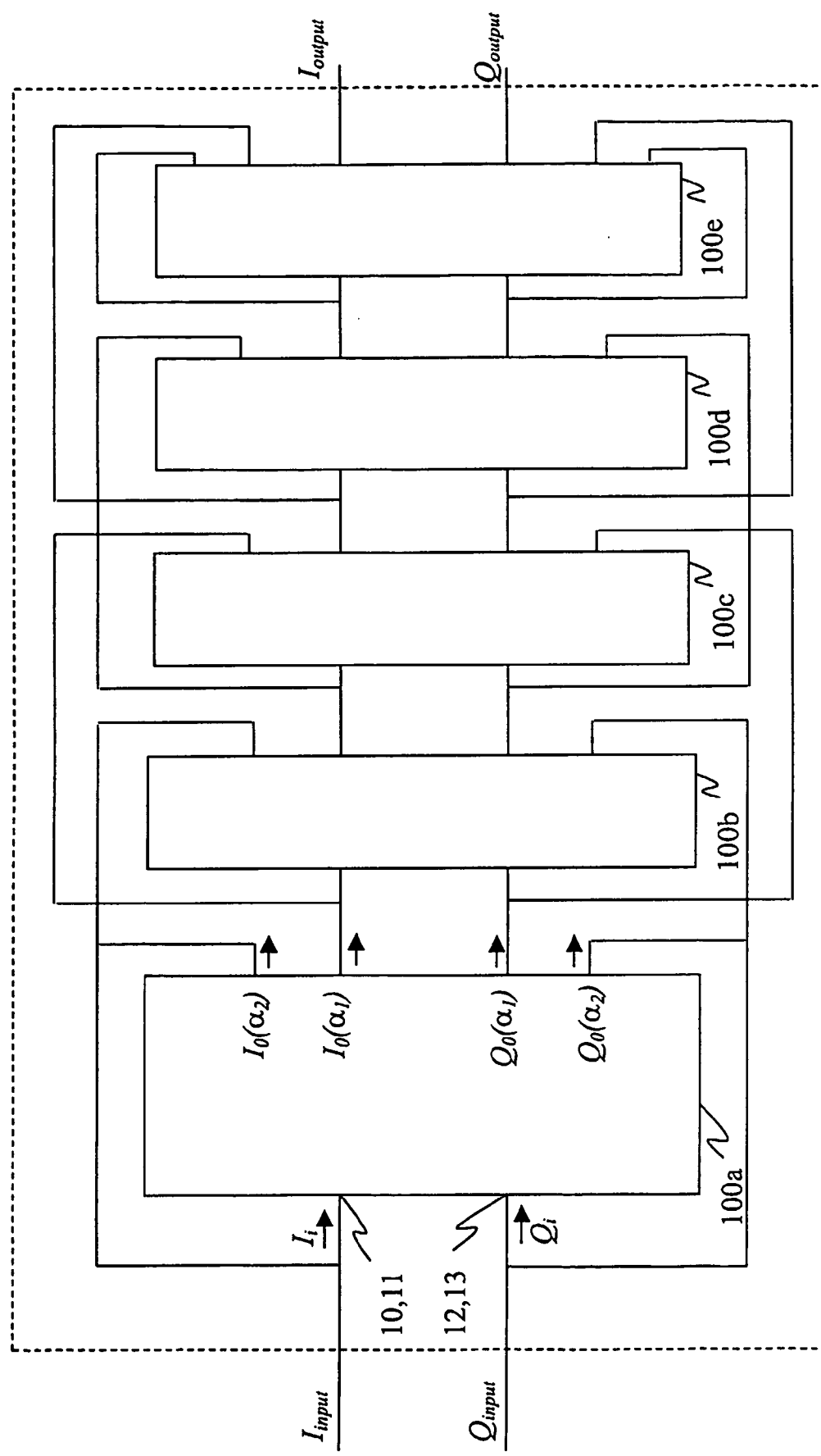
FIG. 16 is a schematic diagram of a filter comprising a complex switched-current bilinear integrator in accordance with the invention.

FIG. 16 illustrates a filter 600 comprising cascade of five complex switched-current bilinear integrators 100a, 100b, 100c, 100d, 100e at least one of which is in accordance with the invention. A filter in-phase input signal $I_{input}$ is coupled to first and second signal inputs 10, 11 of the first complex switched-current bilinear integrator 100a of the cascade and a filter quadrature-phase input signal $Q_{input}$ is coupled to third and fourth signal inputs 12, 13 of the first complex switched-current bilinear integrator 100a of the cascade. In FIG. 16, for clarity, the positive and negative components of differential signals are not identified separately, nor are the positive and negative differential components of interconnections. The first complex switched-current bilinear integrator 100a of the cascade delivers signal outputs $I_o(\alpha_1)$, $Q_o(\alpha_1)$ and $I_o(\alpha_2)$, $Q_o(\alpha_2)$ which have been scaled by scaling factors α1 and $\alpha_2$ respectively. Each of the integrators 100a–100e in the cascade deliver output signals which have been scaled by scale factors selected according to well known design methods to achieved a required frequency response from the filter 600. There are feedback and feed forward couplings between the integrators 100a–100e in the cascade which also are selected according to well known design methods. Filtered signals $I_{output}$, $Q_{output}$ are delivered at outputs of the filter from the final integrator stage 100e of the cascade. The filter 600 may be implemented as an integrated circuit.

Figure 17:
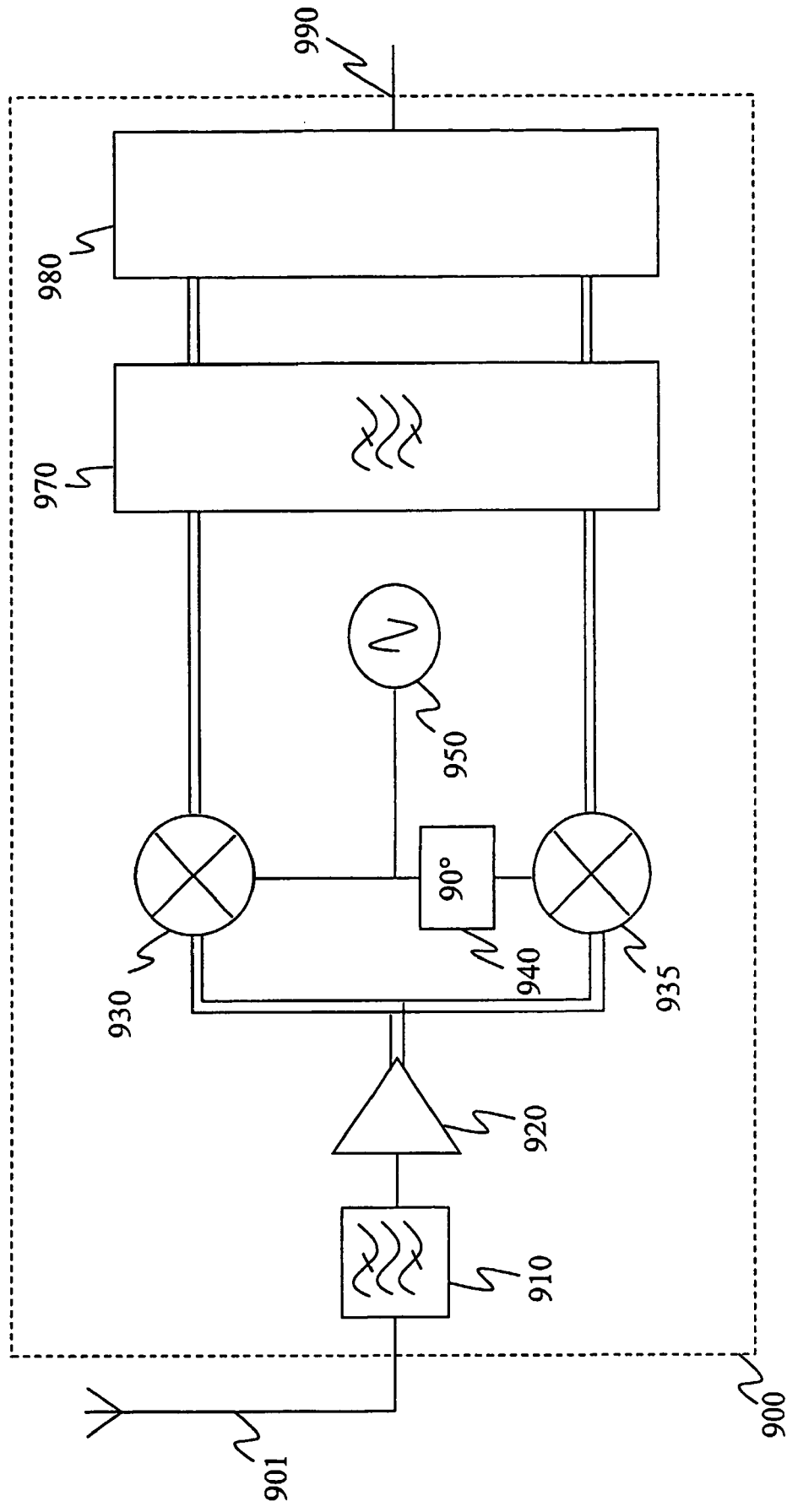
FIG. 17 is a schematic diagram of a radio receiver including a filter comprising a complex switched-current bilinear integrator in accordance with the invention.

FIG. 17 illustrates a radio receiver 900 having a low-IF architecture and including a filter comprising a complex switched-current bilinear integrator in accordance with the invention such as that described above with reference to FIG. 16. The receiver 900 is coupled to receive a radio signal from an antenna 901. The received signal is filtered in an RF antenna filter 910 and then amplified in a low noise amplifier 920. The low noise amplifier 920 is coupled to deliver a balanced signal to a first input of a first mixer 930 and to a first input of a second mixer 935. A second input of the first mixer 930 receives a local oscillator signal from a local oscillator 950 and delivers a balanced in-phase low-IF signal to a polyphase low-IF filter 970 which comprises a complex switched-current bilinear integrator having dynamic element matching 100 in accordance with the invention. A second input of the second mixer 935 receives a local oscillator signal from the local oscillator 950 via a 90° phase shifter 940 and delivers a balanced quadrature-phase low-IF signal to the polyphase low-IF filter 970. The polyphase low-IF filter 970 delivers balanced in-phase and quadrature-phase filtered low-IF signals to a data demodulator 980 which delivers demodulated data at an output 990. The radio receiver 900 may be implemented as an integrated circuit.

INDUSTRIAL APPLICABILITY

Electronic circuits employing switched-current techniques, for example channel filters for radio receivers.

The invention claimed is:

1. A complex switched-current bilinear integrator comprising, first and second inputs for a differential pair of in-phase input signals, third and fourth inputs for a differential pair of quadrature-phase input signals, first and second outputs for a differential pair of in-phase output signals, third and fourth outputs for a differential pair of quadrature-phase output signals, coupling the first, second, third, and fourth inputs and first, second, third, and fourth outputs by an arrangement of sample-and-hold circuits and coupled scaling circuits, and means for dynamic element matching whereby at least some of the scaling circuits are matched according to a predetermined switching sequence and whereby a coupling change of at least one coupled scaling circuit coupled to any of the sample-and-hold circuits occurs a beginning of a sampling operation by that sample-and-hold circuit.

2. A complex switched-current bilinear integrator as claimed in claim 1, wherein the arrangement of sample-and-hold circuits and coupled scaling circuits provides means for integrating signals present at each of the first second third and fourth inputs, means for scaling each of the integrated signals by a first scale factor, means for scaling the integrated signals by a second scale factor, and means for coupling the integrated signals scaled by the second scale factor to the inputs whereby said in-phase and quadrature-phase signals are cross-coupled.

3. A complex switched-current bilinear integrator as claimed in claim 2, wherein at least some of the scaling circuits applying the first scale factor are interchanged.

4. A complex switched-current bilinear integrator as claimed in claim 2, wherein at least some of the scaling circuits applying the first scale factor are interchanged and at least some of the scaling circuits applying the second scale factor are interchanged.

5. A complex switched-current bilinear integrator as claimed in claim 4, wherein the interchanging effects averaging of four first scale factors.

6. A complex switched-current bilinear integrator as claimed in claim 5, wherein the predetermined switching sequence has a repetition period of four of the sampling operations.

7. A complex switched-current bilinear integrator as claimed in any one of claims 2 to 6, wherein the means for integrating comprises a pair of the sample-and-hold circuits alternately performing a sampling operation and alternately performing a holding operation, and wherein the sampling operation comprises sampling simultaneously a signal present at one of the inputs and a signal held concurrently by the other sample-and-hold circuit of the pair.

8. A complex switched-current bilinear integrator as claimed in claim 7, comprising a switching means for swapping said signals at the first and second inputs and for swapping signals at the third and fourth input, the swapping being synchronous with the alternating sampling operation and holding operation of the sample-and-hold circuits coupled to the respective inputs.

9. A filter comprising a complex switched-current bilinear integrator as claimed in any one of claims 1 to 8.

10. A radio receiver comprising the filter as claimed in claim 9.

11. Apparatus comprising a complex switched-current bilinear integrator as claimed in any one of claims 1 to 8.

12. A complex switched-current bilinear integrator as claimed in claim 2, wherein at least some of the scaling circuits applying the second scale factor are interchanged.

13. A complex switched-current bilinear integrator as claimed in claim 4, wherein the interchanging effects averaging of four second scale factors.

* * * * *